United States Patent
Chen

(10) Patent No.: US 6,288,330 B1
(45) Date of Patent: Sep. 11, 2001

(54) COVER DEVICE ADAPTED TO PROVIDE ELECTROMAGNETIC INTERFERENCE SHIELDING TO AN ELECTRONIC COMPONENT THAT IS RECEIVED IN A HOUSING OF AN ELECTRICAL APPLIANCE

(75) Inventor: Ying-Hu Chen, Taipei (TW)

(73) Assignee: Compal Electronics, Inc., Taipei (TW)

( * ) Notice: Subject to any disclaimer, the term of this patent is extended or adjusted under 35 U.S.C. 154(b) by 0 days.

(21) Appl. No.: 09/414,490

(22) Filed: Oct. 8, 1999

(51) Int. Cl.[7] ................................................. H05K 9/00
(52) U.S. Cl. .......................................... 174/35 R; 361/816
(58) Field of Search ........................... 174/35 R, 35 GC, 174/35 MS; 361/816, 818, 800

(56) References Cited

U.S. PATENT DOCUMENTS 6,140,577 * 10/2000 Rapaich et al. .................... 174/35 R
6,169,666 * 2/2001 Venant ................................. 361/816

* cited by examiner

Primary Examiner—Jessica Han
(74) Attorney, Agent, or Firm—Pillsbury Winthrop LLP

(57) ABSTRACT

A cover device is adapted to provide electromagnetic interference shielding to an electronic component that is received inside a housing of an electrical appliance. The housing is formed with an access opening to permit access to the electronic component inside the housing. The cover device includes an outer dielectric cover plate adapted to be mounted on the housing so as to cover the access opening, and an inner conductive member. The inner conductive member includes a conductive plate, a plurality of conductive spring pieces and a conductive connecting unit. The conductive plate is mounted on an inner surface of the cover plate. The conductive spring pieces are disposed on at least one edge of the conductive plate, and are spaced apart from each other. Each of the spring pieces has opposite first and second end portions. The first end portions of the spring pieces are connected to the conductive plate. The conductive connecting unit interconnects the second end portions of the spring pieces.

3 Claims, 5 Drawing Sheets

COVER DEVICE ADAPTED TO PROVIDE ELECTROMAGNETIC INTERFERENCE SHIELDING TO AN ELECTRONIC COMPONENT THAT IS RECEIVED IN A HOUSING OF AN ELECTRICAL APPLIANCE

BACKGROUND OF THE INVENTION

1. Field of the Invention

The invention relates to a cover device, more particularly to a cover device for providing electromagnetic interference shielding to an electronic component.

2. Description of the Related Art

FIG. 1 illustrates a conventional cover device for providing electromagnetic interference shielding to an electronic component. The conventional cover device includes a cover plate 11 formed with a plurality of posts 111 that project from an inner surface thereof, and a conductive plate 12 formed with a plurality of positioning holes 123. The posts 111 extend into the positioning holes 123 for positioning the conductive plate 12 on the inner surface of the cover plate 11. The conductive plate 12 has a plurality of spring pieces 121 that are formed thereon by punching and that are spaced apart from each other. Each of the spring pieces 121 is connected integrally to the conductive plate 12 and inclines away from the cover plate 11.

Since the spring pieces 121 are made of metal, after a long period of time, the spring pieces 121 easily experience elastic fatigue such that the conventional cover device cannot provide good electrical connection between the spring pieces 121 and associated conductors on a housing that receives the electronic component. Furthermore, the spring pieces 121 have sharp edges that can cause injury during assembly.

SUMMARY OF THE INVENTION

Therefore, the object of the present invention is to provide a cover device for providing electromagnetic interference shielding to an electronic component that is both safe and durable.

According to the present invention, a cover device is adapted to provide electromagnetic interference shielding to an electronic component that is received inside a housing of an electrical appliance. The housing is formed with an access opening to permit access to the electronic component inside the housing. The cover device includes an outer dielectric cover plate adapted to be mounted on the housing so as to cover the access opening, and an inner conductive member.

The inner conductive member includes a conductive plate, a plurality of conductive spring pieces and a conductive connecting unit. The conductive plate is mounted on an inner surface of the cover plate. The conductive spring pieces are disposed on at least one edge of the conductive plate, and are spaced apart from each other. Each of the spring pieces has opposite first and second end portions. The first end portions of the spring pieces are connected to the conductive plate. The conductive connecting unit interconnects the second end portions of the spring pieces.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
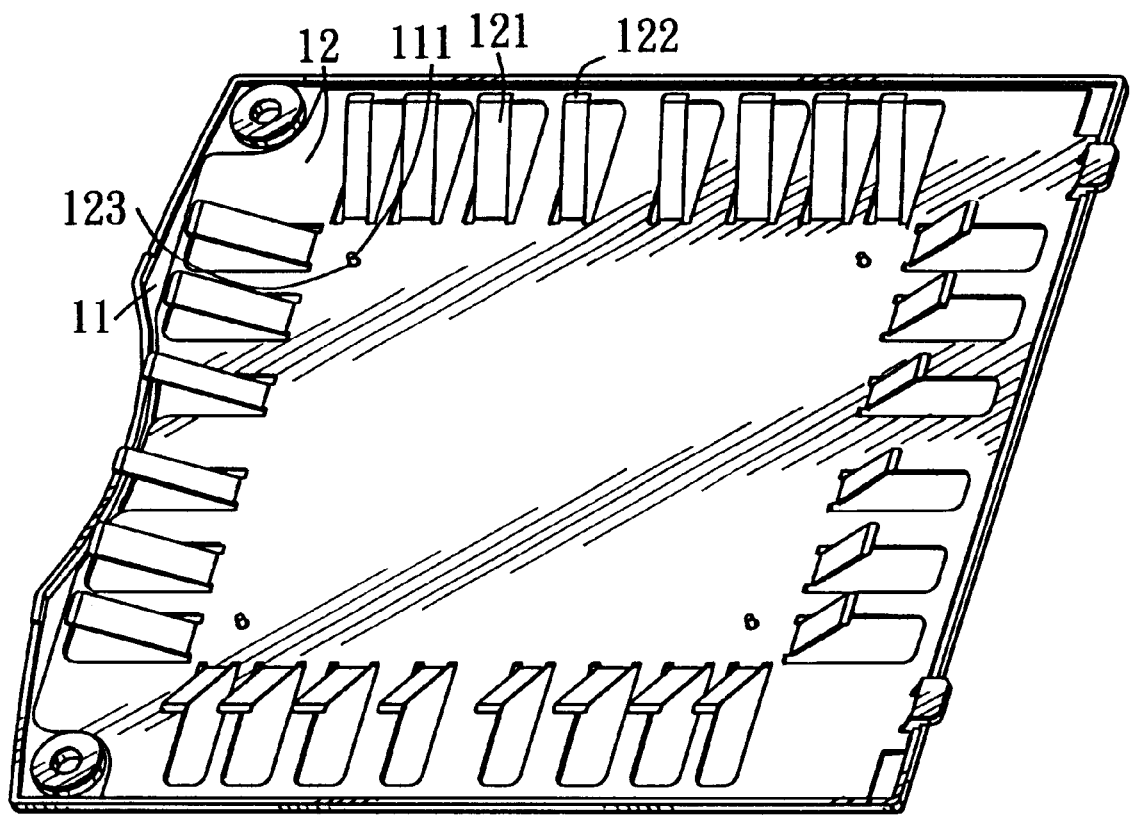
FIG. 1 is a perspective view of a conventional cover device.
Figure 2:
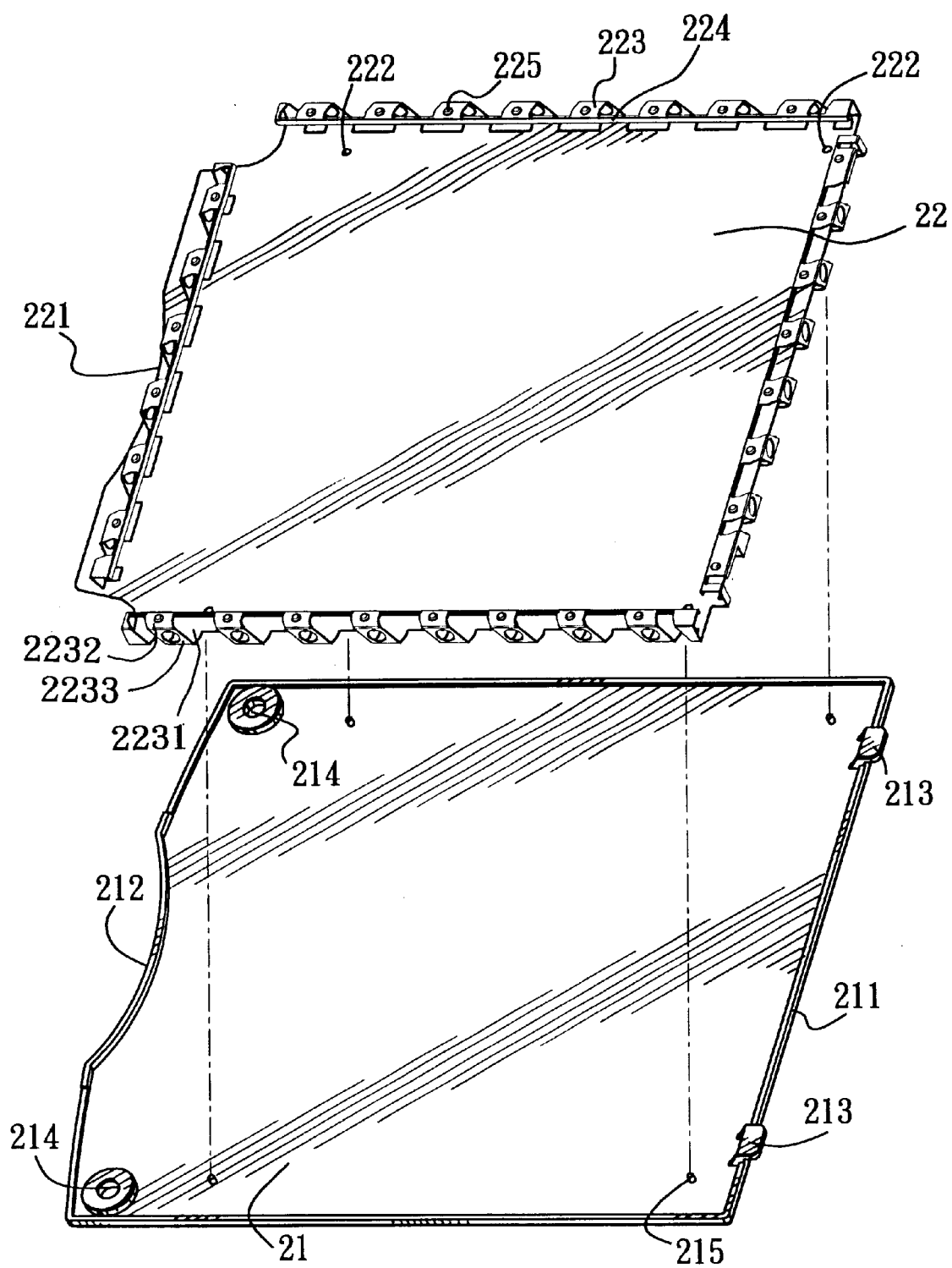
FIG. 2 is an exploded perspective view showing the first preferred embodiment of a cover device according to the present invention.
Figure 3:
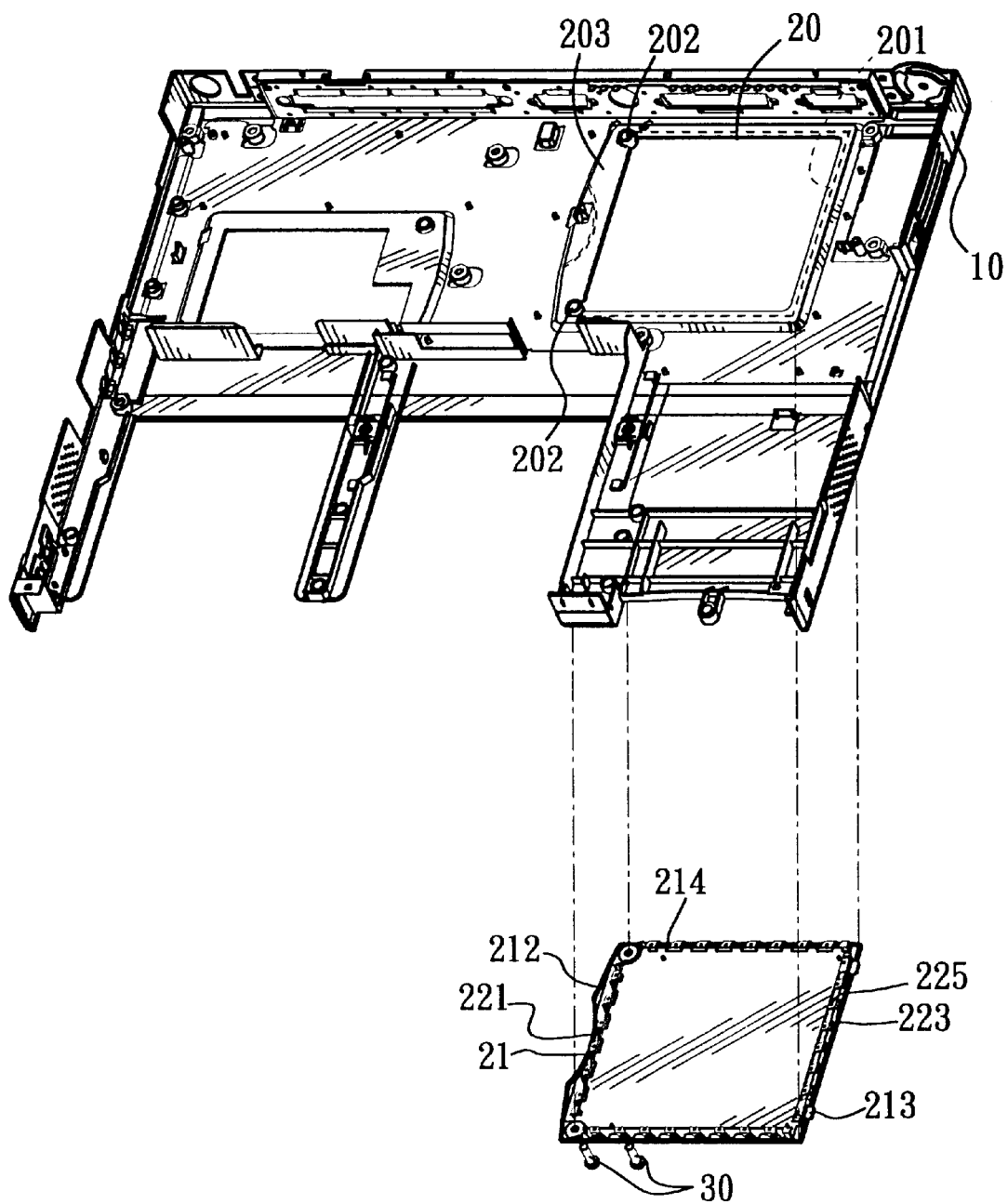
FIG. 3 is an exploded perspective view showing an assembly of the cover device and a computer housing.
Figure 4:
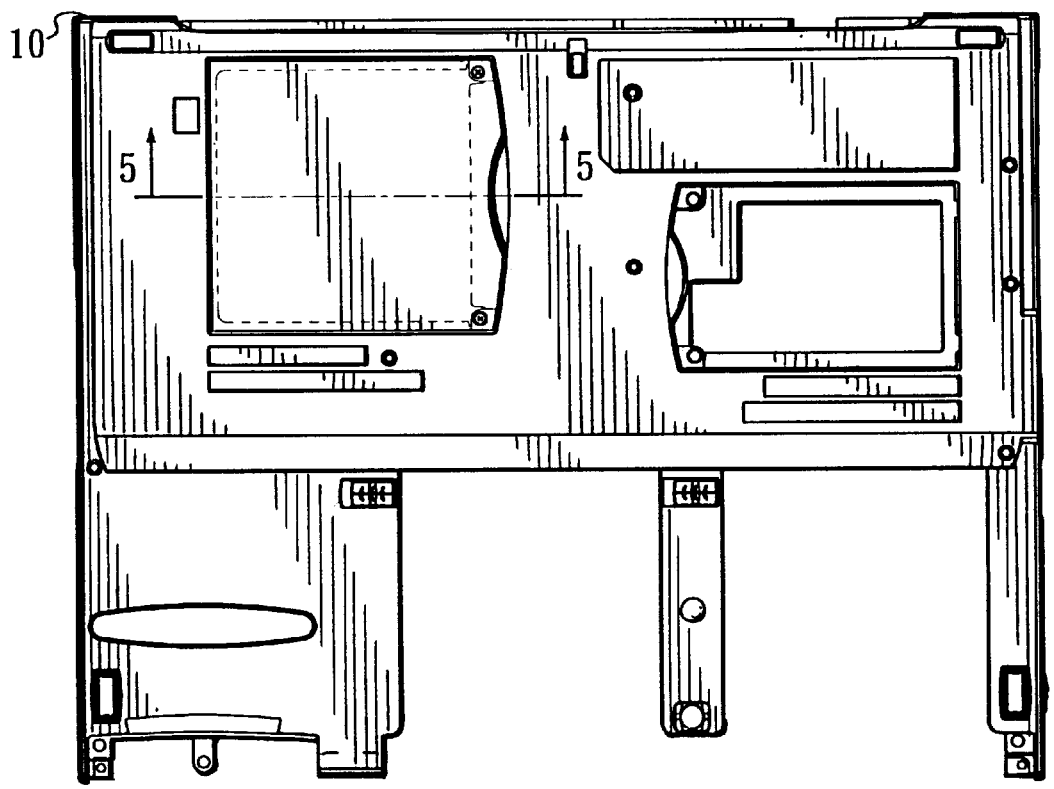
FIG. 4 is a schematic view of the assembly in FIG. 3.

Before the present invention is described in greater detail, it should be noted that like elements are denoted by the same reference numerals throughout the disclosure.

Referring to FIGS. 2 to 5, according to the first preferred embodiment of the present invention, a cover device is adapted to provide electromagnetic interference shielding to an electronic component 12, such as a memory module, that is mounted on a main board 12 and that is received inside a housing 10 of a portable computer. The housing 10 is formed with an access opening 20 to permit access to the electronic component 12 inside the housing 10, opposite threaded holes 202 adjacent to a first side of the access opening 20, and an engaging portion 201 adjacent to a second side of the access opening 20 opposite to the first side. A grounding piece 203 is mounted on an inner surface of the housing 10, and extends and projects into the periphery of the access opening 20. The cover device includes an outer dielectric cover plate 21 and an outer conductive member.

The dielectric cover plate 21 is adapted to be mounted on the housing 10 so as to cover the access opening 20. The dielectric cover plate 21 has an engaging edge 211 formed with two engaging pieces 213 for engaging with the engaging portion 201 of the housing 10, curved edge 212 opposite to the engaging edge 211, two through holes 214 adjacent to the curved edge 212 and corresponding to the threaded holes 202 in the housing 10, and a plurality of positioning posts 215 disposed on an inner surface thereof. A pair of screws 30 extend threadedly into the through holes 214 and the threaded holes 202 in the housing 10, respectively, for positioning the dielectric cover plate 21 on the housing 10.

The conductive member includes a conductive plate 22, a plurality of conductive spring pieces 223 and a conductive connecting unit.

The conductive plate 22 is mounted on an inner surface of the cover plate 21, and has a plurality of positioning holes 222. The positioning posts 215 extend into the positioning holes 222 for positioning the conductive plate 22 on the inner surface of the dielectric cover plate 21.

Figure 5:
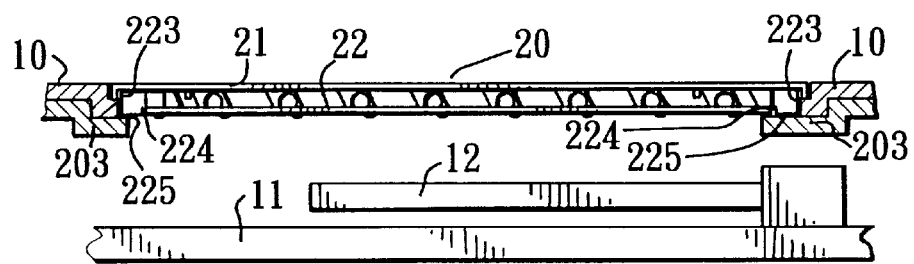
FIG. 5 is a fragmentary sectional view showing the cover device assembled on the computer housing.

The conductive spring pieces 223 are disposed on three edges, and on one side of the conductive plate 22 having an arched edge 221. The spring pieces 223 are spaced apart from each other. Each of the spring pieces 223 has opposite first and second end portions 2231, 2232, and an upright portion 2233. The first end portions 2231 of the spring pieces 223 are connected to the conductive plate 22, and extend integrally and horizontally from the conductive plate 22. Each of the upright portions 2233 extends integrally and upwardly from the first end portion 2231 and is connected integrally to the second end portion 2232 such that the second end portion 2232 extends parallel to and is disposed above the first end portion 2231. The second end portion 2232 of each of the spring pieces 223 is formed with a contact post 225 that is adapted to make contact with the grounding piece 203 of the housing 10, as shown in FIG. 5.

The connecting unit includes four conductive strips 224 connected integrally to the second end portions 2232 of the spring pieces 223.

Figure 6:
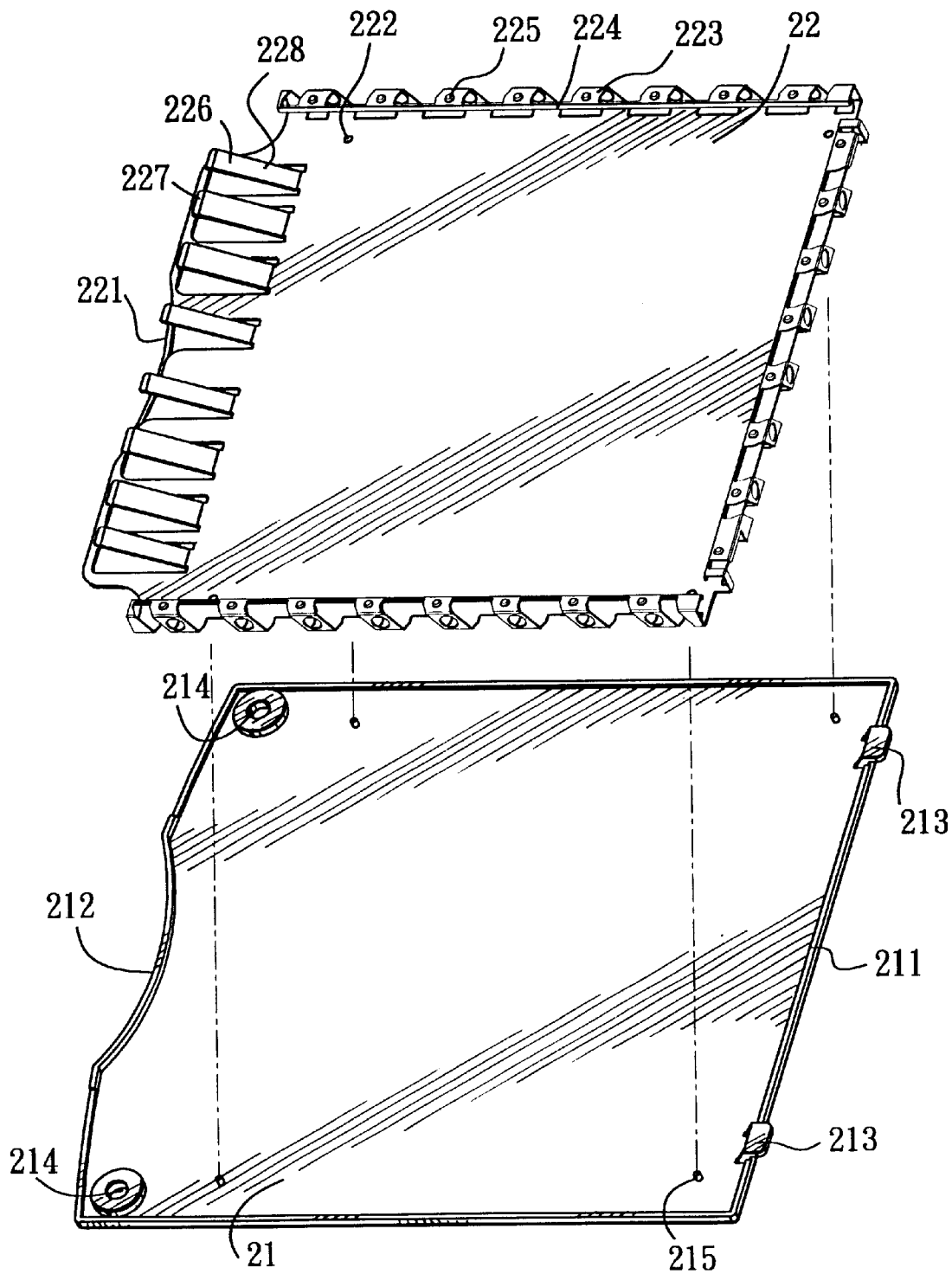
FIG. 6 is an exploded perspective view showing the second preferred embodiment of a cover device according to the present invention.

FIG. 6 illustrates the second preferred embodiment of the present invention, which is based on the first preferred embodiment. In FIG. 6, a plurality of spring units 226 formed by punching are disposed on the side having the arched edge 221 instead of the spring pieces 223. Each of the spring units 226 has opposite first and second end portions 228, 227. The first end portion 228 of each of the spring units 226 is connected to the conductive plate 22. The second end portion 227 of each of the spring blocks 226 extends from the first end portion 228 and inclines away from the dielectric cover plate 21 for contacting the grounding piece 203.

Since each of conductive strips 224 of the connecting unit interconnects the second end portions 2232 of the spring pieces 223, the spring pieces 223 are not easily deformed after a long period of time, and the spring pieces 223 can be easily and safely handled during assembly. The object of the invention is thus met.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A cover device to adapted provide electromagnetic interference shielding to an electronic component that is received inside a housing of an electrical appliance, the housing being formed with an access opening to permit access to the electronic component inside the housing, said cover device comprising:

an outer dielectric cover plate adapted to, be mounted on the housing so as to cover the access opening; and an inner conductive member including
 a conductive plate mounted on an inner surface of said cover plate,
 a plurality of conductive spring pieces disposed on at least one edge of said conductive plate and spaced apart from each other, each of said spring pieces having opposite first and second end portions, said first end portions of said spring pieces being connected to said conductive plate, and
 a conductive connecting unit interconnecting said second end portions of spring pieces,
 wherein said first end portions of said spring pieces extend integrally and horizontally from said conductive plate, each of said spring pieces further having an upright portion that extends integrally and upwardly from said first end portion and that has said second end portion connected integrally thereto such that said second end portion extends parallel to and is disposed above said first end portion.

2. The cover device as claimed in claim 1, wherein said second end portion of each of said spring pieces is formed with a contact post.

3. The cover device as claimed in claim 2, wherein said connecting unit includes at least one conductive strip connected integrally to said second end portions of said spring pieces.

\* \* \* \* \*